United States Patent [19]

MacCollum et al.

[11] Patent Number: 5,658,416
[45] Date of Patent: Aug. 19, 1997

[54] METHOD AND APPARATUS FOR PEELING A LAMINATE

[75] Inventors: George O. MacCollum, Bellingham; Peter A. Bouchard, Ashland, both of Mass.; Dana F. Schuh, Derry, N.H.; Richard A. Rosenthal, Winchester, Mass.; Frank S. Silveira, Wilmington, Mass.; Donald G. Josephson, Burlington, Mass.

[73] Assignee: Polaroid Corporation, Cambridge, Mass.

[21] Appl. No.: 261,159

[22] Filed: Jun. 17, 1994

[51] Int. Cl.$^6$ ............................................ B32B 35/00
[52] U.S. Cl. ................ 156/344; 156/584; 271/281; 271/282; 271/285; 430/256
[58] Field of Search ....................... 156/344, 584; 271/280, 281, 282, 285; 430/256, 257, 258, 259, 260, 261, 262

[56] References Cited

U.S. PATENT DOCUMENTS

| | | | |
|---|---|---|---|
| 2,143,714 | 1/1939 | Rosebush | 270/68 |
| 2,560,301 | 7/1951 | Morrison | 154/1 |
| 2,659,673 | 2/1953 | Rogers et al. | 95/88 |
| 2,725,228 | 11/1955 | Seward | 270/61 |
| 2,947,539 | 8/1960 | Breuers et al. | 271/64 |
| 3,017,179 | 1/1962 | Stuckens | 271/64 |
| 3,297,317 | 1/1967 | Strevenart | 271/64 |
| 3,518,145 | 6/1970 | Christensen | 156/248 |
| 3,542,361 | 11/1970 | Call | 271/64 |
| 3,685,712 | 8/1972 | Turner et al. | 227/3 |
| 3,727,815 | 4/1973 | Schwartz | 226/5 |
| 3,770,554 | 11/1973 | Jones et al. | 156/510 |
| 3,794,546 | 2/1974 | Cohen et al. | 136/344 |
| 3,804,399 | 4/1974 | Rupp | 270/62 |
| 3,848,998 | 11/1974 | Yonekura et al. | 156/584 |
| 3,883,390 | 5/1975 | Cohen et al. | 156/584 |
| 3,907,628 | 9/1975 | Buske | 156/574 |
| 3,909,257 | 9/1975 | Davidson | 96/1 M |
| 3,951,727 | 4/1976 | Greenberg | 156/584 |
| 3,970,381 | 7/1976 | Meagher et al. | 355/3 R |
| 4,046,298 | 9/1977 | Schroeder, Jr. | 225/2 |
| 4,055,418 | 10/1977 | Buckley et al. | 96/1 PS |

(List continued on next page.)

FOREIGN PATENT DOCUMENTS

| | | | |
|---|---|---|---|
| 690532 | 6/1965 | Italy. | |
| 59-181340 | 3/1983 | Japan | G03C 5/24 |
| 2-024248 | 7/1985 | Japan. | |
| 62-276555 | 12/1987 | Japan | G03F 7/00 |
| 63-199349 | 8/1988 | Japan | G03C 1/76 |
| 1-105253 | 4/1989 | Japan | G03D 13/00 |
| 1-203158 | 8/1989 | Japan | B65H 29/64 |
| 1-231047 | 9/1989 | Japan | G03C 7/00 |
| 4-153658 | 5/1992 | Japan | G03F 7/34 |
| 4-191743 | 7/1992 | Japan | G03F 7/34 |

*Primary Examiner*—Mark A. Osele
*Attorney, Agent, or Firm*—Leslie Payne

[57] ABSTRACT

Methods and apparatus for peeling a laminate containing image media wherein the leading edge portion of the laminate is struck by beater blades to initially separate the leading edge portion of one layer from the laminate. The separated leading edge portion is then transported into a nip defined by a peel surface and a lower peel roll after which the leading edge portion is bent about the peel surface by a folder driven by a linkage mechanism. While the leading edge portion of the laminate is bent, one layer is held by a vacuum device while the remainder of the laminate returns to its path of travel under its own resiliency. The separated layer is then peeled from the laminate by take-away rolls while guided by the peel surface. The remainder of the laminate is guided by a deflector roll to move along the path at a predetermined angle while the layer is being peeled. In one method, the layer is peeled at an angle to the longitudinal direction of the laminate. This is effected by orienting the peel surface and the lower peel roll with their axes extending at an angle to the path of travel of the laminate. Further, a method includes having the layer peeled at an angle other than the screen angle of the imaged and non-imaged portions of the laminate. A small diameter peel surface is used for effective peeling.

61 Claims, 13 Drawing Sheets

U.S. PATENT DOCUMENTS

| | | | |
|---|---|---|---|
| 4,087,182 | 5/1978 | Aiba et al. | 355/100 |
| 4,097,383 | 6/1978 | Ohtani et al. | 210/500 |
| 4,165,251 | 8/1979 | Matsumoto et al. | 156/584 |
| 4,173,507 | 11/1979 | Tobey | 156/443 |
| 4,173,510 | 11/1979 | Tobey | 156/584 |
| 4,177,104 | 12/1979 | Parker | 156/584 |
| 4,182,645 | 1/1980 | Hill | 156/361 |
| 4,183,751 | 1/1980 | Matsumoto et al. | 430/258 |
| 4,216,048 | 8/1980 | Gehweiler | 156/344 |
| 4,273,606 | 6/1981 | Trilli | 156/388 |
| 4,366,925 | 1/1983 | Fanene | 228/20 |
| 4,421,608 | 12/1983 | McBride | 204/12 |
| 4,443,094 | 4/1984 | Ricciardi | 355/3 SH |
| 4,504,571 | 3/1985 | Yamamura et al. | 430/253 |
| 4,526,634 | 7/1985 | Beer | 156/64 |
| 4,631,103 | 12/1986 | Ametani | 156/241 |
| 4,631,110 | 12/1986 | Tsumura et al. | 156/584 |
| 4,645,195 | 2/1987 | Scranton et al. | 271/246 |
| 4,685,991 | 8/1987 | Herrmann et al. | 156/344 |
| 4,693,587 | 9/1987 | Shigenobu et al. | 355/3 FU |
| 4,724,032 | 2/1988 | Kay | 156/344 |
| 4,770,737 | 9/1988 | Seki | 156/584 |
| 4,798,645 | 1/1989 | Pak | 156/344 |
| 4,798,646 | 1/1989 | Sumi | 156/364 |
| 4,820,369 | 4/1989 | Kubo | 156/344 |
| 4,855,012 | 8/1989 | Sumi | 156/584 |
| 4,861,406 | 8/1989 | Baker et al. | 156/230 |
| 4,862,064 | 8/1989 | Sumi | 324/65 P |
| 4,867,836 | 9/1989 | Hamamura et al. | 156/584 |
| 4,867,837 | 9/1989 | Seki et al. | 156/584 |
| 4,880,488 | 11/1989 | Matsuo et al. | 156/344 |
| 4,888,080 | 12/1989 | Sumi | 156/344 |
| 4,897,148 | 1/1990 | Orlandi | 156/584 |
| 4,898,058 | 2/1990 | Seifert | 83/870 |
| 4,898,376 | 2/1990 | Sumi | 271/272 |
| 4,908,093 | 3/1990 | Sumi | 156/584 |
| 4,915,770 | 4/1990 | Haeda et al. | 156/344 |
| 4,944,827 | 7/1990 | Lilly et al. | 156/384 |
| 4,961,817 | 10/1990 | Seki | 156/584 |
| 5,000,814 | 3/1991 | Sumi | 156/344 |
| 5,000,816 | 3/1991 | Seki et al. | 156/584 |
| 5,090,680 | 2/1992 | Yashiro | 271/186 |
| 5,092,832 | 3/1992 | Crowley | 493/421 |
| 5,104,473 | 4/1992 | Tveit et al. | 156/268 |
| 5,108,534 | 4/1992 | Tveit et al. | 156/344 |
| 5,110,393 | 5/1992 | Sumi et al. | 156/344 |
| 5,116,454 | 5/1992 | Kurihara | 156/584 |
| 5,141,584 | 8/1992 | Schuh | 156/344 |
| 5,169,474 | 12/1992 | Binder | 156/584 X |
| 5,169,475 | 12/1992 | Tobin | 156/344 |
| 5,252,169 | 10/1993 | Bechmann | 156/344 |
| 5,254,200 | 10/1993 | Takagi | 156/344 |
| 5,259,681 | 11/1993 | Kitazawa et al. | 400/621 |
| 5,269,873 | 12/1993 | Platzer et al. | 156/584 |
| 5,282,918 | 2/1994 | Heist et al. | 156/344 |
| 5,294,514 | 3/1994 | Lynch et al. | 430/203 |

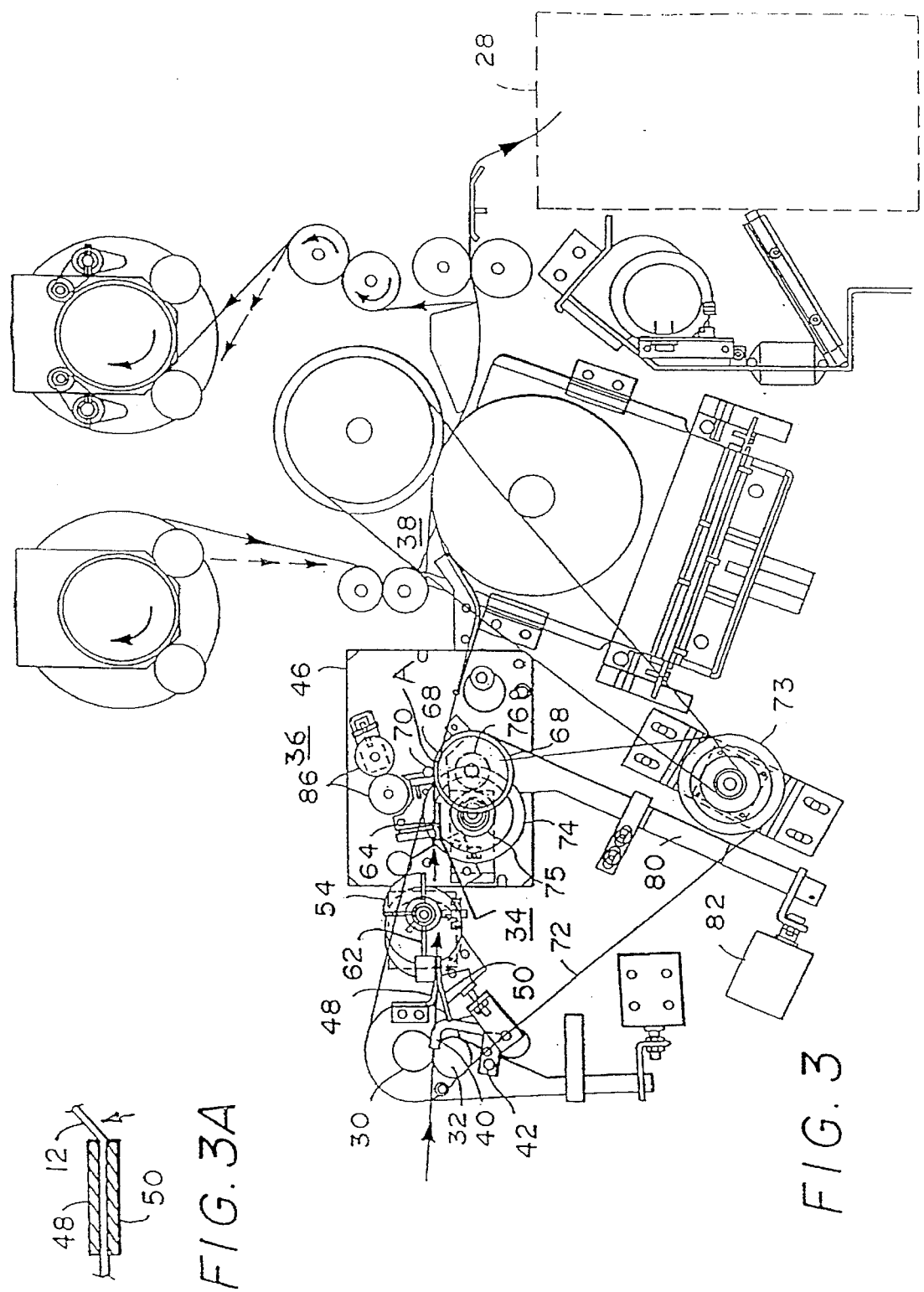

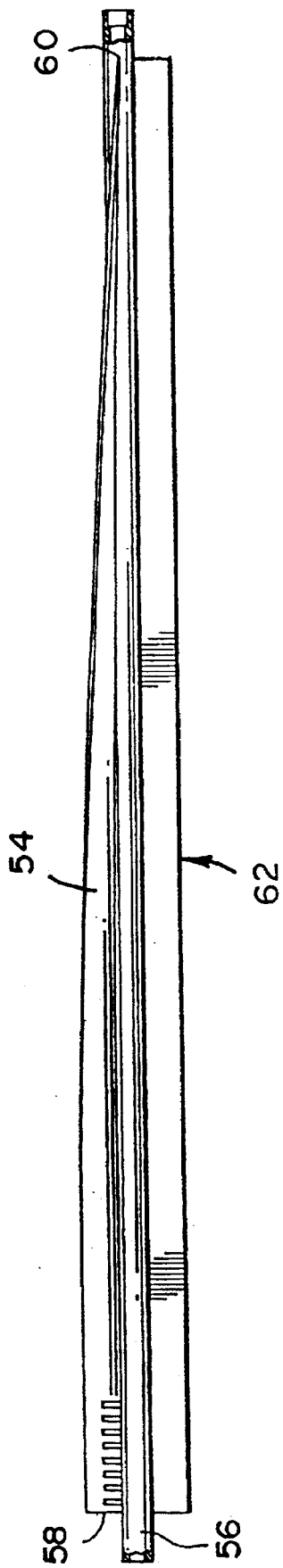
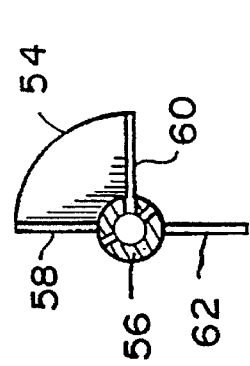
FIG. 8
FIG. 9

METHOD AND APPARATUS FOR PEELING A LAMINATE

BACKGROUND OF THE PRESENT INVENTION

The present invention generally relates to methods and apparatus for peeling or delaminating a composite sheet structure or laminate containing image media.

In the graphics arts field, it is extremely important that so-called master images of the original objects being reproduced in a prepress operation be free of visually discernable image defects that would impact negatively in the formation of commercially acceptable prints. The master images are, in turn, used in the subsequent formation of either positive or negative copies, depending on the platemaking process employed. Since the final printed image will only be as good as its master image, considerable efforts are undertaken to produce only the highest quality master.

Some conventional approaches in the graphic arts area, such as letterpress and offset lithography, rely on the use of halftones to reproduce continuous tone original images. Halftone techniques employ very small and defined screen dots of varying sizes and arranged in varying spacing patterns to reproduce continuous tone images. The screen dots are relatively small and range in size. If these screen dots are not produced with the desired definition and with the desired spacing patterns, the resultant continuous tone images will be less than the quality desired and thus, render the prints commercially unacceptable. Therefore, it is extremely important that the halftone screen dots and image patterns be precisely formed and processed in a manner which preserves their desired definition and spacing characteristics.

Conventional halftone approaches in prepress printing rely on silver halide photography and can include a graphics art camera of the darkroom type. Development of the latent images on the light sensitive film is achieved through a series of chemical processing steps which include immersing the film in a special developer that converts the silver halide to metallic silver in proportion to the amount of exposure received. Each film type uses special developing agents and other combinations of chemicals and water for fixing and stabilizing the film during processing. Some film processors use lasers for generating images instead of cameras. It will be appreciated that the entire silver halide process suffers several shortcomings because of the chemical storage, handling and disposal concerns it occasions. Moreover, silver halide film is light sensitive and this presents other handling issues in order to protect it.

A recent development in the image forming arts has achieved high quality, high resolution images, such as radiological images of the medical type, without the need for silver halide film and processing techniques along with their attendant equipment and chemical processing issues. In this regard, high quality and high resolution images have been produced by a dry process imaging approach which uses laser beams imaging on a thermographic image forming medium. Examples of this kind of thermographic image forming medium are described in commonly assigned International Patent Application No. PCT/US 87/03249 published Jun. 16, 1988, under International Publication Number WO 88/04237; and, U.S. Pat. No. 5,200,297. After this laminate has been imaged, it is delaminated by peeling one layer therefrom and having the remaining imaged media relaminated with a protective coating. For a more detailed description of the imaging technique and an associated peeling process, reference is made to commonly assigned U.S. Pat. Nos.: 5,141,584 to Schuh et al and 5,159,352 to Ferla et al. However, it is has been determined that dry peeling the laminate can produce image defects which render a commercially unacceptable product. The peeling defects and their severity are caused by a variety of factors associated with the peeling action itself, and the physical and/or chemical properties of the media. For instance, some of the image defects or artifacts of the resultant peeled images are attributable to the alternating high and low density areas in the image media. For instance, some of these artifacts occur in the vicinity of areas of exposed and unexposed portions that may be both transverse and linear to the web directions. It is, therefore, highly desirable to produce images which are free of these kinds of defects.

OBJECTS OF THE PRESENT INVENTION

An object of the present invention is to provide novel and improved methods and apparatus for delaminating a composite sheet structure or laminate, preferably, containing imaging media. Although the invention need not be limited thereto, one type of such laminate may include a vertically frangible and thermally image forming layer including a pigment layer, such as carbon and a plurality of layers bonded to opposite sides of the pigment layer by adhesive layers. Included in the aforementioned object is the provision of such methods and apparatus which will serve to reduce defects in the image forming media due to delamination so as to improve the quality of the image that may be produced through use of the laminate.

A further object is to provide novel and improved methods and apparatus for peeling a laminate containing imaging media and which are suitable for commercial production and use in conjunction with existing print engines, such as laser scanning devices of the thermal actuating type.

SUMMARY OF PREFERRED FORMS OF THE INVENTION

According to a preferred form of the invention, a laminate containing image forming media of the type described above is transported to a preliminary peeling or separating station where at it is supported adjacent a leading edge portion thereof and struck from one side thereof to another, preferably from the thicker side to the thinner side of the laminate by a delaminating member. This bends the leading edge portion about the support causing initial separation of at least one of the layers of the laminate. It is preferred that the leading edge portion be struck as aforesaid a number of times. In one preferred form of the invention, the leading edge is struck a first time with a rotating helical delaminating blade which sequentially engages the leading edge portion. In addition the leading edge portion is struck a second time by a rotating delaminating blade. Bending the laminate as aforesaid causes a layer of the leading edge portion to separate from the remainder of the laminate. In one preferred form of the invention, the leading edge portion is initially separated to a predetermined distance measured in a direction along the path of travel so as to facilitate subsequent laminate peeling and to limit the delamination to an extent which could prevent air pockets causing delamination during peeling if such air pockets were upstream of a peeling nip.

Once the foregoing initial separation is achieved, the laminate is transported into a nip defined by a lower peel roll and a peel surface means. The lower peel roll is then moved toward the peel surface means so as to engage the laminate behind the separated leading edge portion. The leading edge portion is then bent again to one side thereof about the upper peel surface against a holding mechanism, preferably a vacuum device, which holds the separated layer while permitting the remainder of the laminate to return to the path under its inherent resiliency. Prior to holding the separated layer, it is preferred that the leading edge portion be bent to one side about the peel surface means to insure separation of the layer. The hold on the separated layer is released and the separated layer is peeled from the remainder of the laminate as the latter continues to be transported along the path. The peeling is accomplished for example, by exerting tension forces on the separated layer, such as for example by means of eject rolls which act in conjunction with the lower peel roll to control the peeling.

In a preferred method of the invention the peeling is accomplished at an angle to the longitudinal center line of the laminate for the purpose of reducing linear and transverse pattern defects in the resultant images. Preferred apparatus is provided for feeding the laminate at an angle to the path of travel for achieving such angled peeling. In another preferred approach peeling is done at an angle other than a screen angle at which successive lines or rows of exposed and unexposed regions are formed. During the peeling process, the remainder of the laminate at the downstream side of the upper peel surface is maintained by a deflector roll at a predetermined angle relative to the portion of the laminate on the upstream side of the upper peel surface. The deflection angle is controlled so as to enhance control of the separation of the exposed portions of the image forming layer from the unexposed portions by imparting an appropriate bending ratio between the final image sheet and the separated sheet.

In accordance with one preferred apparatus of the invention for performing the aforementioned bending step, a linkage mechanism is used to bring an elongated folding member into engagement with the leading edge portion of the laminate to bend or fold it about the upper peel surface as described above. A suitable motor drives the linkage mechanism between operative and inoperative positions. In addition, the aforementioned deflector roll is cammed to a position where it engages and guides the remainder of the laminate at the aforementioned predetermined angle. This occurs when the folder returns to an inoperative position allowing the laminate to return to the travel path at which time it is engaged by the deflector roll and maintained at the aforementioned angle. This deflection also increases the likelihood of separation of the exposed and unexposed portions and enhances web stability.

Also in the preferred embodiment the peel surface means has a relatively small radius, for example three millimeters, about which the layer is peeled and further the peel surface means is positioned such that its radius of curvature is offset relative to the radius of curvature of the lower peel roll. In addition, the upper peel surface and the lower peel roll are positioned at an angle to the path of travel of the laminate so that the layer is peeled at an angle to the longitudinal direction of the laminate as mentioned above. In another preferred approach peeling is done at an angle other than at a screen angle of each exposure line or row which contains aligned exposed and unexposed image forming portions or screen dots.

In addition to the methods and apparatus described above, other novel and improved methods and apparatus to be described below, are utilized in accordance with the present invention.

BRIEF DESCRIPTION OF THE DRAWINGS

Other objects and advantages of the present invention will become apparent from the following more detailed description taken in conjunction with the attached drawings in which:

FIG. 3 is a side elevational view with certain parts in cross-section and others removed for clarity, of apparatus constituting one embodiment of the apparatus of the present invention and which performs one method of the present invention;

FIG. 3a is a diagrammatic view illustrating a preliminary bending operation performed by a portion of the apparatus;

FIG. 8 is a side view of a delaminating blade utilized in the apparatus;

FIG. 9 is an end view of the delaminating blade of FIG. 8;

DETAILED DESCRIPTION

Figure 1:
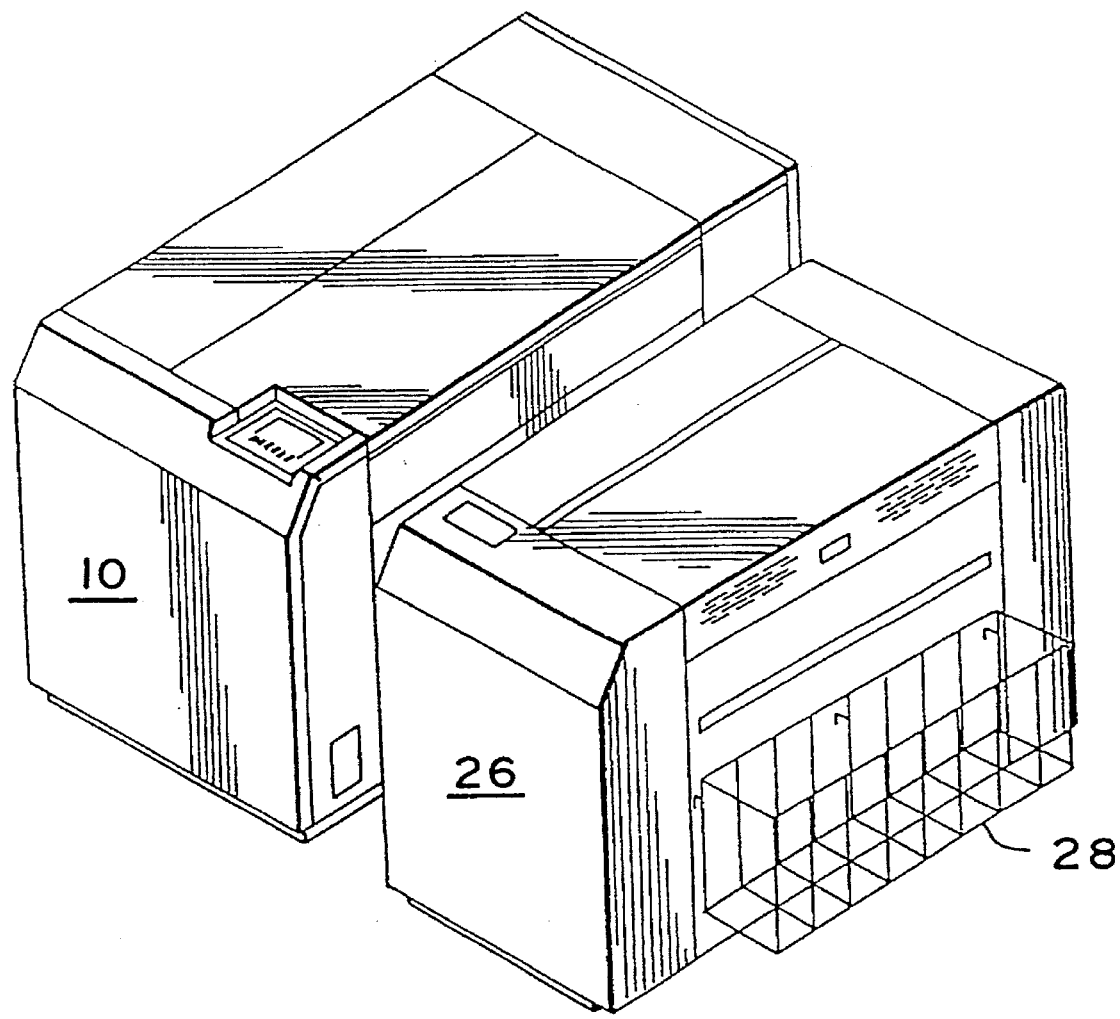
FIG. 1 is a perspective view of associated print engine and peeler-laminator machines, the latter performing and incorporating methods and apparatus of the present invention.
Figure 2:
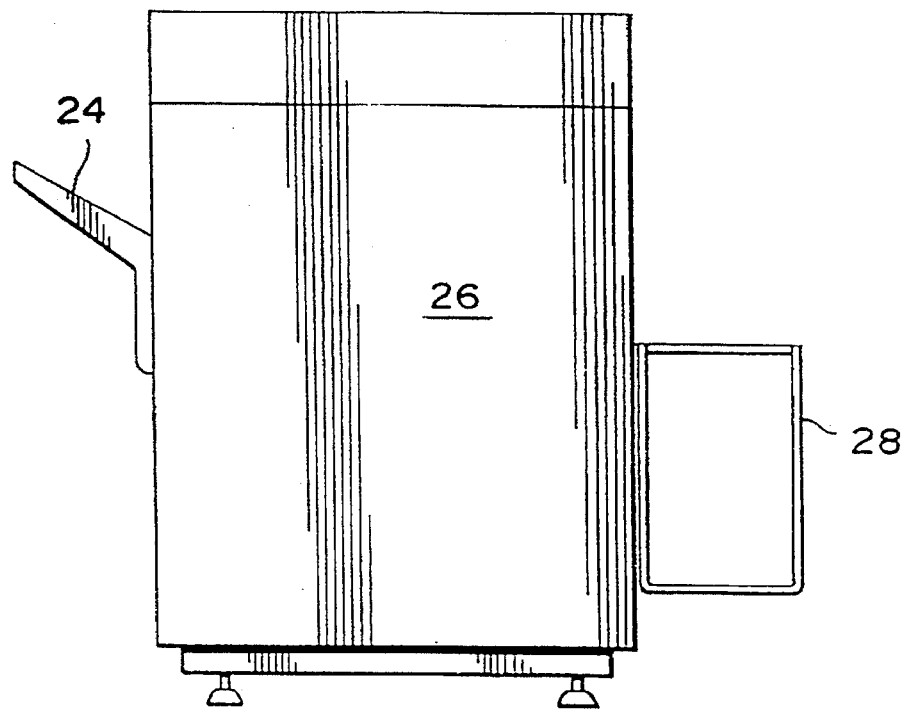
FIG. 2 is an end view of the peeler-laminator machine shown in FIG. 1.
Figure 1A:
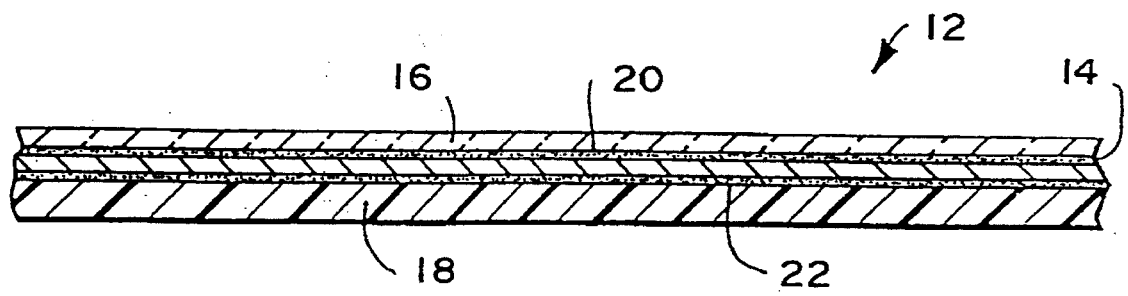
FIG. 1a is a longitudinal cross-sectional view of one type of laminate with which the present invention is concerned.

Referring now to the drawings in detail, there is shown in FIG. 1 a print engine or thermal laser imaging device 10 for producing laminates of the type shown for example at 12 in FIG. 1a including image media, that have been produced in the print engine 10 through thermal imaging, such as by a laser or any other suitable device. Byway of example, the laminate 12 may include an internal layer 14 comprised of a pigment such as carbon, opposite image-bearing layers 16 and 18 on opposite sides of the pigment layer, and adhesive layers 20 and 22 respectively bonding the image-bearing layers to the pigment layer. As will be described below, the methods and apparatus of the present invention may be utilized to peel or delaminate one of the image-bearing layers. For a further description of laminates with which the present inventions are concerned, reference may be had to commonly assigned U.S. Pat. No. 5,159,352 to Ferla et al and 5,141,584 Schuh et al; it being understood that the laminate itself forms no part of the present invention. The disclosures of the aforementioned patents 5,159,352 and 5,141,584 are hereby incorporated by reference herein as part hereof. It will be appreciated that the present invention contemplates the peeling of other, preferably image forming laminates such as can be used in the formation of photomasks for printed circuit boards and the like.

After the laminate 12 is imparted with an image by the print engine 10, it is deposited by the latter at an inlet 24 of a peeler-laminator 26 which contains apparatus in accordance with the present invention for performing methods in accordance with the present invention. As will be described in detail below, the peeler-laminator 26 peels one of the layers (the "takeaway" or "throw-away") of the laminate 12 which layer is discarded. The remainder (the "keeper") of the laminate is then relaminated with another layer over the surface which was exposed by the peeling process. In the illustrated embodiments, the thicknesses of the sheets 16 and 18; respectively, can be about 0.013 to 0.178 mm (0.5 to 7 mil) and 0.038 to 0.254 mm (0.5 to 10 mil). Other dimensions may, of course, be substituted. While it is not a requirement, it has been found to be advantageous to have one of the sheets relatively stiffer, i.e., less flexible than the other. The difference in stiffness may be provided by a difference in materials of which the sheets 16, 18 are made. Preferably, however, and as shown, the different stiffnesses are attained by one of the sheets, such as strip sheet 16 being thinner than the other or keeper sheet 18. The present invention is concerned with methods and apparatus for peeling the layer prior to the relamination step. However for a description of the relamination method and apparatus, reference may be had to U.S. Pat. No. 5,582,669 Assignee of the present application. After the laminate is processed by the peeler-laminator 26, it is deposited in an outlet receptacle basket 28 to be later used as a master in the formation of a printing drum or cylinder through an etching process which forms no part of the present invention.

Deskewing At The Inlet

Figure 5:
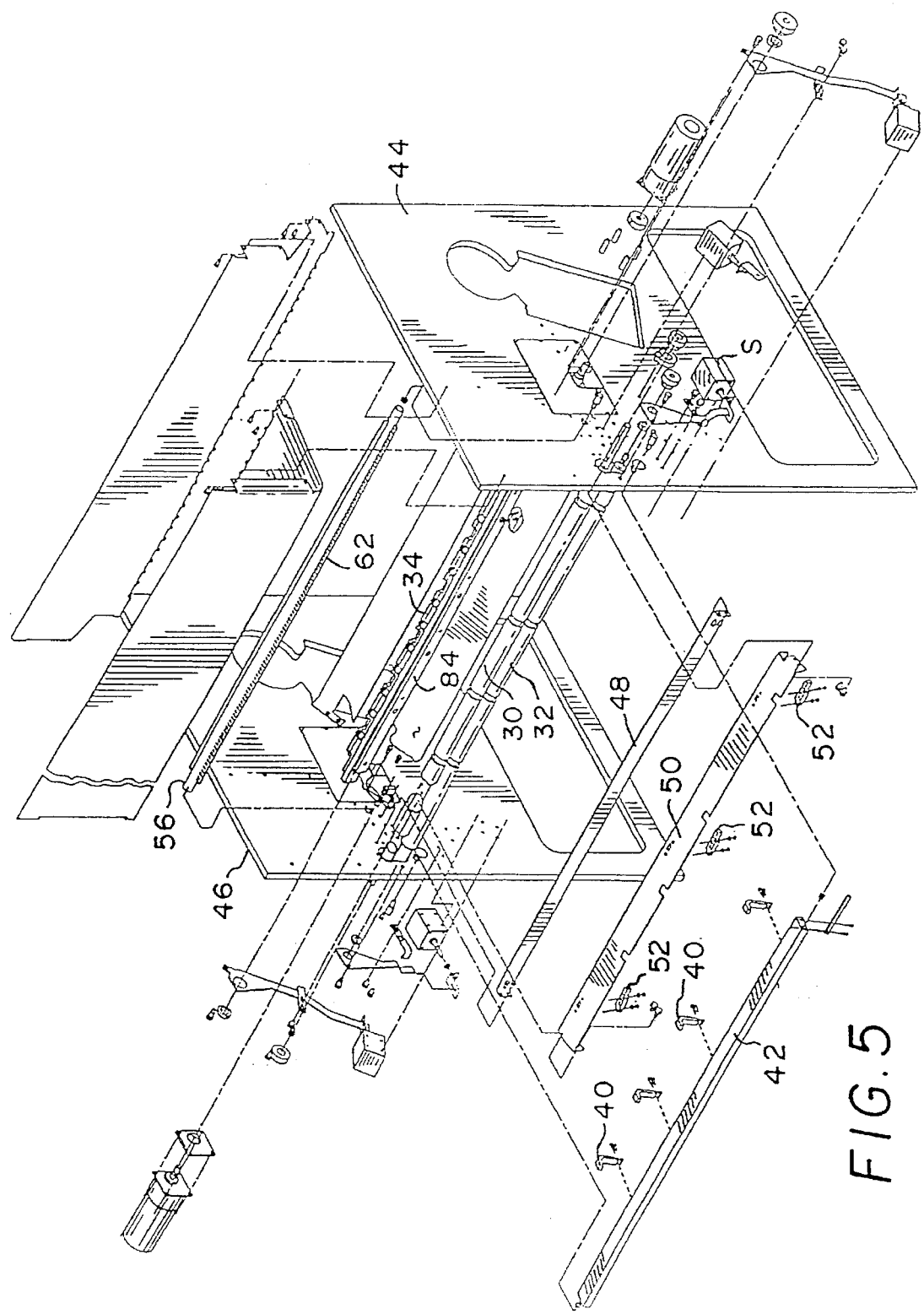
FIG. 5 is an exploded perspective view of the apparatus shown in FIG. 3 with certain parts removed but with certain details added.

Referring now to FIG. 3, there is shown by a series of arrows a path of travel or transportation of the laminate 12 as it proceeds from inlet rolls 30, 32 to a preliminary separating or peeling station 34, a final peeling station 36, and a relaminating station 38. It will be understood that portions of the peeling station have been removed for clarity of description. As mentioned above, the present invention is concerned with the apparatus and process performed between the inlet rolls 32, 34 and the peeling station 36. Upon receipt of the incoming laminate between inlet rolls 30, 32, the latter are in a spaced apart or inoperative position for receiving the laminate 12. At that time a stop is in an operative position located adjacent and between the nip of the rolls 30, 32 for receiving the leading edge of the laminate to deskew and orient the laminate so that the longitudinal centerline of the laminate extends parallel to the direction of travel of the laminate along the path. In other words, the leading edge of the laminate extends 90° to the direction of travel of the laminate. Any suitable arrangement can be used to provide the noted opening and closing movement of the inlet rollers, such as a solenoid operated lever being coupled to one of the rollers. Moreover, any suitable apparatus may be utilized to provide the stop, however in the specific embodiment shown, a plurality of inverted L-shaped fingers 40 are pivotally mounted below the inlet rolls 30, 32 to move between an operative position shown in FIG. 3 and an inoperative position where they are retracted below and out of the path of travel of the laminate. In the specific form shown and with reference to FIG. 5 as well as FIG. 3, the stop fingers 40 are secured to an elongated arm 42 which in turn is pivotally mounted to the support structure of the machine; the latter being shown by opposite main support walls in the form of plates 44 and 46 on opposite sides of the apparatus. Any suitable solenoid S motor or drive mechanism may be employed for pivoting the arm the arm 42 and operating the stop fingers 40 between their raised and lowered positions.

Preliminary Peeling

Figure 4:
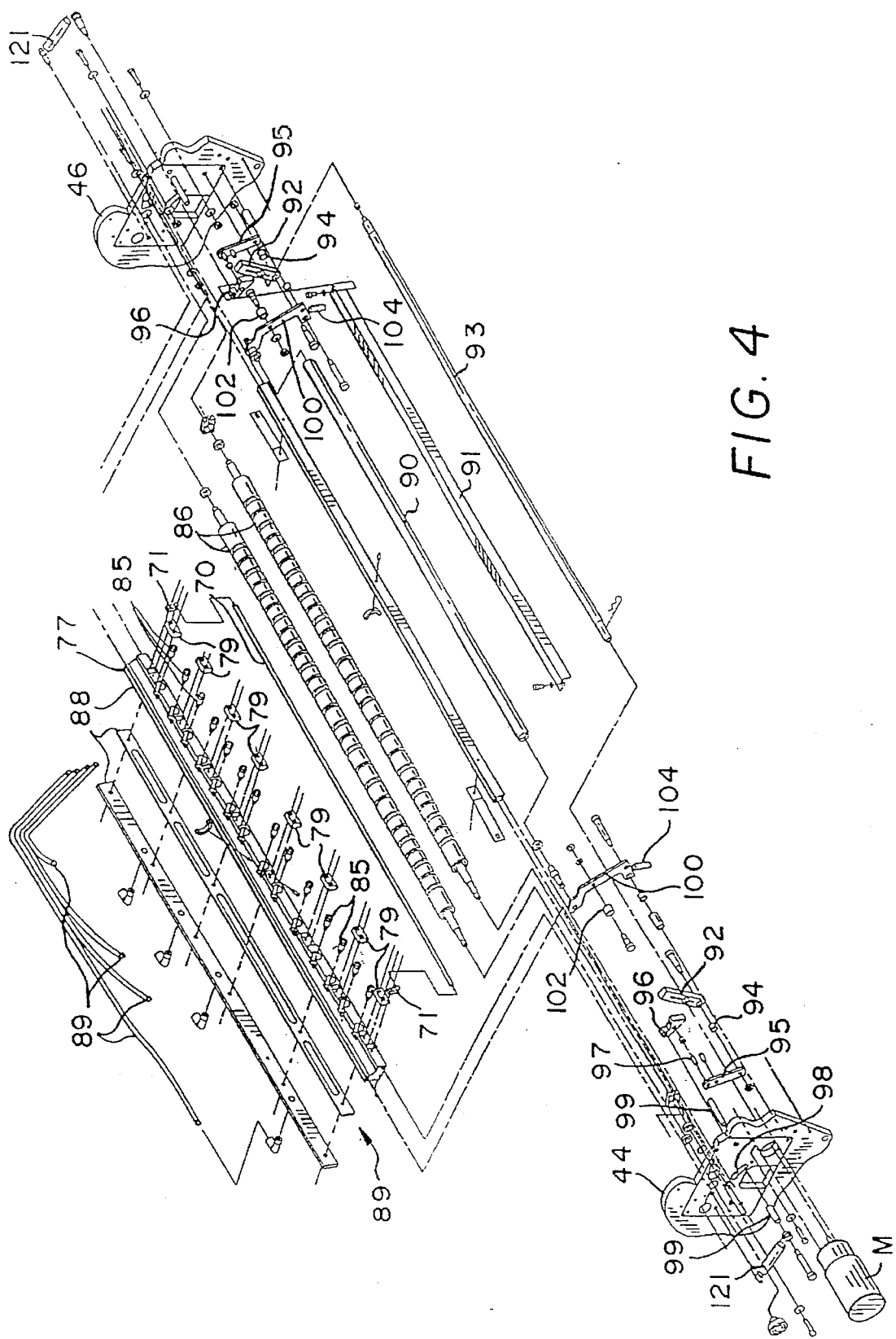
FIG. 4 is an exploded perspective view of the apparatus in FIG. 3 with certain parts removed.

After the laminate 12 has been deskewed by the stop fingers 40, the inlet rolls 30, 32 are moved relative to and towards each other to engage the laminate whereupon the laminate is driven by rotating rollers and the stop fingers are rotated to a lowered or non-skewing position, whereby the laminate can be driven through by the rollers to the preliminary separating or peeling station 34. The latter includes in the specific embodiment shown, upper and lower transversely-extending guide plates 48 and 50 spaced to receive and guide the laminate as it travels at the rate of approximately one inch per second in the particular embodiment described. Other speeds can be used. Guide plates 48, 50 have detectors for determining the width of the laminate as it passes through the guide plates. The sensed information can be used for controlling the application of vacuum. Any suitable detectors, such as infra-red detectors 52 shown in FIG. 4 may be employed. As the laminate emerges from the guide plates 48, 50, the transport speed of the laminate is reduced to approximately one-tenth of an inch per second in the specific embodiment described to enable a preliminary peeling or separation step to be effected at the leading edge portion of the laminate which extends approximately 22 mm. from the leading edge rearwardly of the laminate. During this operation, the leading edge portion of the laminate is struck from one side to the other side to bend the leading edge portion about one of the guide plates and this effects separation of one of the layers of the laminate from the remainder of the laminate. In the specific embodiment shown, the laminate is struck from below to above the laminate to bend the leading edge portion upwardly about the guide plate 48 as shown in FIG. 3a with a sufficient bending moment about a close radius. During such bending, shearing forces on the upper layer or the strip sheet 16 will cause it to separate at the adhesive layer 20 from the pigment layer 14. The leading edge is preferred to be bent to the thin side of the laminate which will be placed in compression, whereas the relatively thicker portion is placed in tension. Aided by the resiliency of the laminate, the leading edge portion is caused to return towards the path of travel after it is bent. In particular, it is preferable that the strip sheet, when bent upwardly, be placed in compression and a portion of the keeper sheet be placed in tension. Release of the bending movement will further release the stored energy of the bending and effect the shearing of the laminate as noted. It is very important for effecting a complete preliminary separation that the leading edge of the laminate extend not too far from the bending radius formed by the upper guide plate 48. If the distance is too short then there is a possibility that a delaminating blade would cut or shear the leading edge from the remainder of the laminate. On the other hand, if the gap between the edge of the delaminating blade and the noted bending radius is too large then it is difficult to induce enough of a fold in the leading edge to effect the kind of preliminary delamination being described. To ensure separation, it is preferred that the leading edge portion be bent to one side thereof several times during the course of travel, although it is possible to bend the laminate in the other direction.

Delaminating Blade Assembly

In the specific embodiment disclosed, a delaminating assembly is utilized to bend the leading edge portion of the laminate, the delaminating assembly including a helical blade 54 of rigid material for example extending helically along and about a shaft 56 to which it is fixed. As shown in FIG. 8, one end 58 of the helical blade 54 is displaced 90° from the opposite end 60 of the helical blade as the blade curves helically about the shaft between the opposite ends thereof. Shaft 56 is located forwardly but adjacent to fixed support plates 48, 50 at 90° to the path of travel and is rotatable about its axis by any suitable motor so that the helical blade will strike from below the leading edge portion or progressing sequentially along the leading edge portion which extends transversely to the path of travel.

After the leading edge portion is bent a first time in the manner aforesaid by the helical blade 54, it is bent a second time by a straight blade 62 of rigid material which is fixed to the shaft 56 at a location spaced 90° from one of the ends of the helical blade 54, as shown in FIGS. 3, 8 and 9. The apparatus including the delaminating blades 54, 62 is designed so that approximately 22 mm. along the leading edge of the laminate is preliminarily separated or peeled by the delaminating blades. This distance is controlled so that the amount of air that enters into the laminate between the separated layer 16 and the remaining layers is sufficient so as to help initiate the subsequent final peeling operation, but not too great as to allow air to become entrained within the layers beyond the desired preliminary distance and possibly impair the image quality of the laminate by causing an undesired delamination from occurring if the air were to be placed before and upstream of the nip of the final peeling step. During this process it is preferred that the leading edge portion be continually advanced so as to allow air to be introduced between the layers which air enhances separation.

Final Peeling

After the laminate is preliminarily peeled by the delaminating blades 54, 62, it is advanced along the path to what is termed herein as a "final peeling station" 36. At this station a nip is defined by a lower peel roll 68 which also is driven for purposes of transporting the laminate along the path, and an upper peel surface means 70 formed in the specific embodiment by a small diameter roll. Referring to FIG. 3, lower peel roll 68 can be driven by the same pulley system which drives the inlet rolls 30, 32 and includes a pulley belt 72 trained about inlet roll 30 and pulleys 73 and 74. Pulley 74 has a roll 75 fixed thereto which drives a roll 76 fixed to peel roll 68 to drive the latter. A separate motor can be used for driving.

In the illustrated embodiment, the strip sheet is pulled at constant tension and the lower peel roll is driven at constant velocity. However, the present invention contemplates driving the strip sheet at constant velocity and having the lower peel roller operated so that it drives with a constant tension or torque.

In another embodiment, the curvature of a stationary peel surface 70 (not shown) is spaced downstream of the lower peel roll. The offset has been determined to enhance separation of exposed and unexposed portions of the laminate as it is being peeled. Preferably the peel surfaces are smooth.

The Peel Surface And Lower Peel Roll

Figure 14:
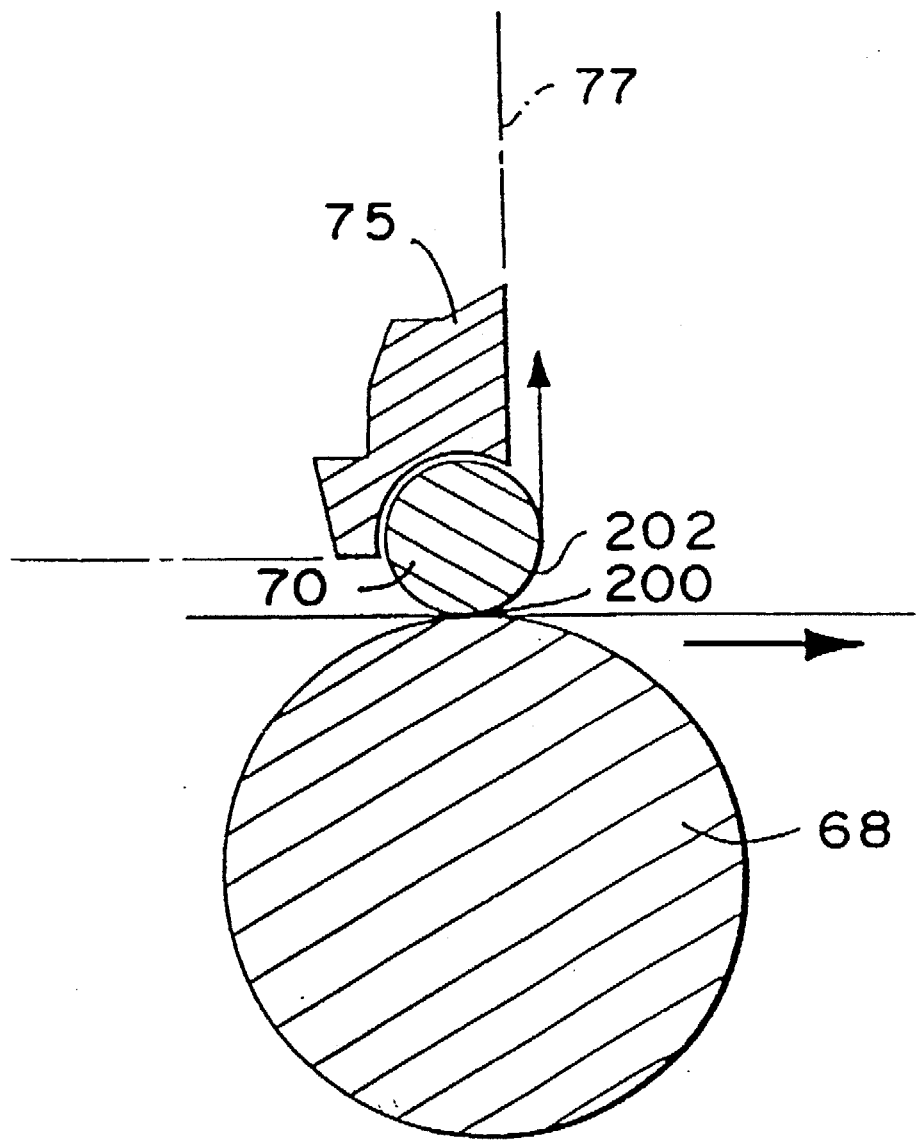

In the embodiment shown in FIG. 3, the peel surface 70 is in the form of a roll or cylindrical shaft mounted for rotation about an axis which extends parallel to the axis of the underlying peel roll 68. It is preferred that the radius of the peel surface roll 70 be approximately three millimeters (3 mm.) or one quarter of an inch (¼"). The present invention contemplates that the radius of the upper peel roll can be in a range of approximately 0.032" to 0.125". It has been determined that the smaller curvature, as aforementioned, minimizes the creation of image artifacts that can be induced by peeling. This is believed to be attributed to controlling the peel point 200 (FIG. 14) deviation which can occur between situations in which low peel forces and high peel forces are experienced. As illustrated, the peel point 200 is very close to the nip between the peel surface roll 70 and the lower peel roller 68. It creates a bag 202, wherein the laminate is spaced from the surface of the roll 70. If the radius of curvature were larger, then the peel point 200 would be further from the nip and this would tend to create a larger bag with the associated artifact problems. This is, in part, due to the fact that the peel force varies in accordance with image content. As the peel force increases, peeling and hence the peel point occurs further from the peel nip. Increasing peel force creates a peel point further from the nip. This continuing deviation of the peel point occurring between regions of high and low peel force creates image artifacts. Control over the peel point deviation can be controlled using a smaller curvature. Specifically, the peel point deviation will be smaller than with larger peel surface curvature. In this regard, the peel point 200 as shown under high peel forces is not far from the nip; see FIG. 14. Correspondingly, those image artifacts that are induced by peel point variations of the aforementioned type can be minimized substantially or even avoided. Furthermore and although not shown in the drawings, it is preferred that the center of curvature of the peel surface 70 be offset upstream from the center of curvature of the peel roll 68. Peel surface roll 70 and the underlying lower peel roll 68 are suitably mounted in the main support walls 44, 46 on the opposite sides of the machine to perform their functions. An advantage of having a rolling surface for the peel surface is that it substantially reduces or even avoids the formation of image artifacts which are caused by dirt and debris remaining on the peel surface. In one preferred embodiment, the lower peel roll 68 may have a core of approximately fifty millimeters (50 mm.) and a covering of high friction material such as silicone having an outside diameter of approximately fifty-six millimeters (56 mm.) and a durometer of 40. The surface finish of the silicone has a roughness of 30 micro-inches. Although in the embodiment shown, the peel surface roll 70 is mounted for rotatable movement, in other embodiments (not shown), the peel surface may be made as a stationary member having an arcuate surface having a small radius of curvature similar to that of roll for engaging the laminate during the final peeling process as will be described below. Furthermore although the peel surface 70 has been shown as a cylindrical rod, other arcuate shapes (not shown) may be employed in carrying out the present invention. The peel surface roll 70 in this embodiment is driven frictionally by the lower peel roll at areas adjacent the laminate being passed through the nip. This invention also envisions that the upper peel surface roll 70 can be positively driven.

When the leading edge of the laminate enters the nip between peel surface 70 and the lower peel roll 68, these elements are in a separated position for receipt of the leading edge portion of the laminate. For this purpose one of the peel surface or the lower peel roll is made to be moved towards and away from the other. In the embodiment shown in FIG. 3 the lower, peel roll 68 is mounted for pivotal movement towards and away from peel surface 70 by means of an arm 80 secured to the end of the peel roll 68 and actuated by a solenoid 82. The leading edge of the laminate is fed through the nip of peel surface 70 and the lower peel roll 68 a distance approximately one inch (1") in one embodiment of the invention. The nip defined by the peel surface and the peel roll is then reduced by moving the peel roll 68 towards the peel surface 70 so that the leading edge portion is engaged between the peel roll and the peel surface at a location just behind approximately one inch from the leading edge of the laminate at a location which has not been separated by the delaminating blades 54, 62. In this way entrapment of air under the layer separated by the delaminating blades is avoided which could otherwise adversely effect image quality during subsequent peeling should air be entrained before the peeling nip.

The upper peel surface roll 70 is rotatably mounted in axially spaced rod supports 71 mounted on opposite ends of an elongated peel bar 77. The peel surface roll 70 is also mounted for rotation in a plurality of axially spaced rod bearings 79 that are affixed to the peel bar 77.

Bending The Laminate About The Peel Surface

After the leading edge of the laminate is engaged between the peel roll surface 70 and the lower peel roll 68, the leading edge portion is subjected to bending preferably at least once for separating the upper layer at the leading edge portion from the remainder of the laminate.

In the specific embodiment shown, the leading edge portion is bent upwardly about the peel roll surface 70 by a bending or folding mechanism located downstream of the peel roll surface. After the leading edge portion of the laminate has been bent upwardly about the peel roll surface 70, the upper layer is held preferably by a vacuum assembly device generally designated 84 in FIG. 4 while the remainder of the laminate is permitted to return, under its own resiliency, towards the path of travel. At this point, the deflecting roll 90 is moved into an operative position in engagement with the keeper sheet. The upper layer is then released by the vacuum device 84 and peeled by any suitable means such as eject rolls 86 from the remainder of the laminate as the latter is transported along the path by the lower peel roll 68. In the specific embodiment shown, the vacuum-holding device 84 includes a plurality of bellows-type vacuum cups 85 connected to a manifold plate assembly 88 spaced transversely above the path of travel and above the peel surface as shown in FIGS. 4 through 7. Vacuum is supplied from a source (not shown) by tubing 89 to the bellows 85 through a manifold including a gasket formed in an elongated manifold plate assembly 88 shown in FIG. 4 which also shows the mounting of the bellows 85 in apertures in an elongated or peel bar 77 plate supported together with the manifold plate assembly by the opposite main support sidewalls 44, 46. Eject rolls 86 are also suitably mounted in the support sidewalls 44, 46 and are driven by any suitable means so that upon receiving the separated leading edge portion of layer 16 of the laminate they will pull the layer under a constant tension, for example approximately one quarter of a pound (¼ lb.) per linear inch to peel the layer from the remainder of the laminate while the layer is driven by the lower peel roll 68 and moves about the peel surface roll 70, and the remainder of the laminate is fed along the path indicated by the arrow A in FIG. 3. In order to ensure the leading edge portion of the laminate will engage the eject rolls 86, upon being bent upwardly, a sufficient length of about one inch or more of laminate is fed through the nip 68, 70 prior to closing the nip as described above. In the preferred embodiment, the remainder of the laminate from which the upper layer has been peeled, is guided by any suitable means such as the deflector roll 90 shown in FIGS. 4, 6 and 7, to extend downwardly at a predetermined angle which in this embodiment can be five degrees (5°) relative to its orientation at the upstream side of the slip surface. This downward deflection angle which is shown in FIG. 3 has been found to improve the peeling process because it enhances web stability and deflects the keeper so as to enhance separation of exposed and unexposed portions.

The Folder And Its Linkage Mechanism

Figure 6:
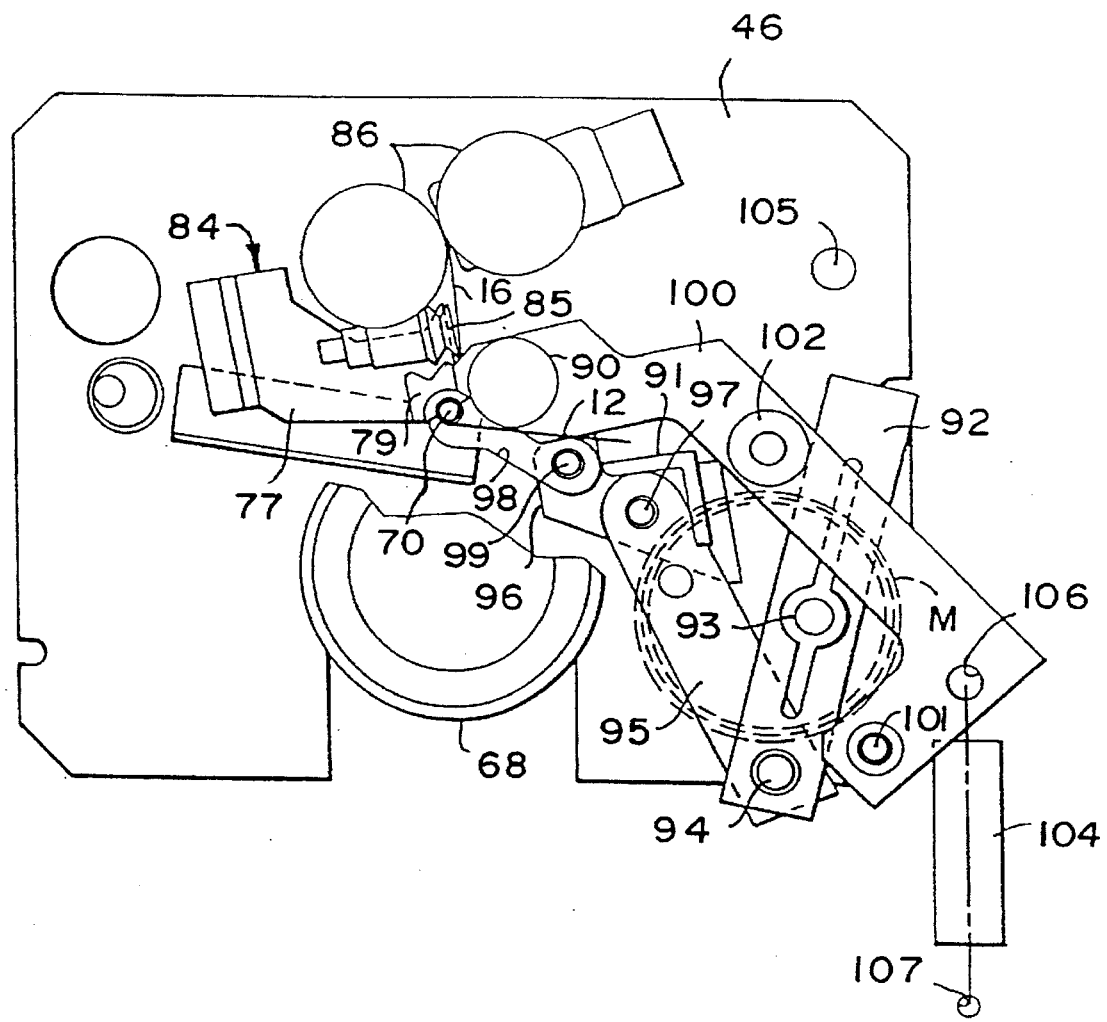
FIGS. 6 and 7 are related fragmental, side elevational views of vacuum and bending devices included in the apparatus, with the views respectively illustrating different positions of the bending device and with certain parts removed.
Figure 7:
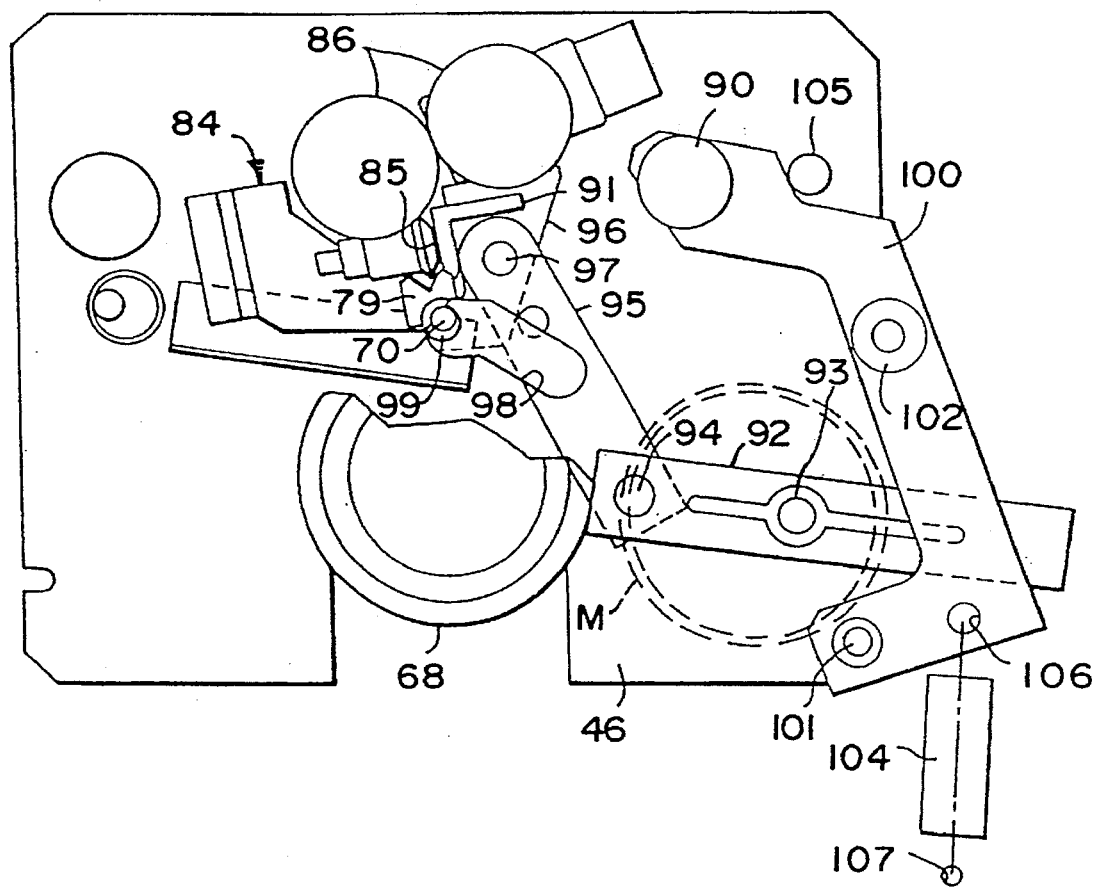

In the preferred embodiment of the apparatus of the present invention, a linkage mechanism is employed to raise and lower a folder assembly 91 which is utilized to bend the leading edge portion of the laminate upwardly about the peel surface roll 70 and upon a second bend, against the vacuum bellows 85 as best shown in FIG. 7. When the linkage mechanism moves to the upper or operative position shown in FIG. 7, folder 91 engages the leading edge portion of the laminate and bends it around the peel roll surface 70. After the leading edge portion has been so bent a first time, the linkage mechanism is returned to a retracted position allowing the leading edge portion to return under its own resiliency towards the path of travel. In the preferred method, after the leading edge portion has been bent by folder 91, a vacuum is applied to the outer surface of the upper layer 16 of the laminate at the bellows 85 so that when the linkage mechanism is lowered to its retracted position, the upper layer 16 will not return with the remainder of the laminate towards the path but rather will be held by the bellows 85. After the folder is retracted, the deflector roll 90 is moved into position and then the upper layer 16 is released by the bellows 85 the linkage mechanism is actuated to retract the folder 91 into the position shown in FIG. 6. During the peeling process, the remainder of the laminate is guided downwardly at the predetermined angle as described above by a deflector roll 90. The eject rolls 86 are driven to continuously peel the upper layer 16 from the remainder of the laminate until the end of the laminate is reached. The operation is then repeated with respect to the next incoming laminate.

Referring to FIGS. 6 and 7 in the specific embodiment shown, the linkage mechanism which operates the folder 91 includes a crank 92 operated by any suitable motor M mounted to the sidewall 46 and whose output shaft 93 is connected to crank 92 to rotate the latter with the output shaft 93. A second link 95 is pivotally connected at one end to the crank 92 by a pivot assembly 94 and at the opposite end to a third or folder link 96 by a pivot assembly 97. Link 96 carries the folder 91 and is also mounted in a slot 98 in the support wall 46 by a pivot assembly 99 for movement along the slot between a lowermost position shown in FIG. 6 and an uppermost position shown in FIG. 7. Referring to FIG. 6, upon clockwise (as viewed in FIG. 6) rotation of crank 92 by its motor M, the folder link 96 will move upwardly along the slot 98 until its pivot 99 is received in the uppermost end of the slot. A spring 121 (FIG. 4) can assist in the movement of the pivot 99 in the slot. Continued rotation of the crank 92 will cause the folder link 96 to rotate about its pivot 99 upwardly to allow the folder 91 to engage and position the leading edge portion of the laminate and the folder against the bellows 85 as shown in FIG. 7. Upon actuation of the crank, in a counterclockwise direction, as viewed in FIG. 7, the linkage will return to its retracted position shown in FIG. 6 leaving the upper layer 16 held by the vacuum bellows while permitting the remainder of the laminate 12 to return to the path where it is engaged by the deflector roll 90, as viewed in FIG. 6.

The Deflector Roll

In the specific embodiment shown, deflector roll 90 is mounted on an arm 100 which is pivoted at 101 to the support wall 46. Upon return of the linkage mechanism as aforedescribed to the retracted position shown in FIG. 7, the crank 92 engages a follower 102 fixed to the arm 100 to drive the arm in the extended or operative position shown in FIG. 6 to position the deflector roll 90 for deflecting the laminate 12 downwardly at the predetermined range of deflection angles as described above. In this extended position, the deflector arms 100 stop against respective supports 71. When the linkage mechanism is moved to the extended position shown in FIG. 7, the crank 92 leaves the follower 102 permitting the arm 100 to be moved by an associated tension spring 104 to the retracted position shown in FIG. 7. The retracted position is defined in the specific embodiment of FIG. 7 by a stop 105 fixed to support wall 46. Also spring 104 has one end engaged in an aperture 106 in arm 100 and an opposite end in a slot 107 formed in support wall 46. The deflection achieved by the deflector roll 90, as noted, can enhance significantly the formation of images without artifacts since it imparts appropriate energy that facilitates separation of the imaged and unimaged areas. The deflection also enhances web stability since the leading edge would be constrained from uncontrolled movement. The deflection angle can be set to a value which is determined to enhance the separation of the exposed from unexposed areas of the film.

After the upper layer 16 has been completely peeled from the laminate 12, the remainder of the laminate is conveyed to a relaminating station 38 where a layer is applied to cover the exposed surface of the laminate from which the upper layer was previously peeled. The entire process is of course repeated on the next laminate which is fed into the inlet 24 of the peeler-laminator.

Angled Peeling

Figure 10:
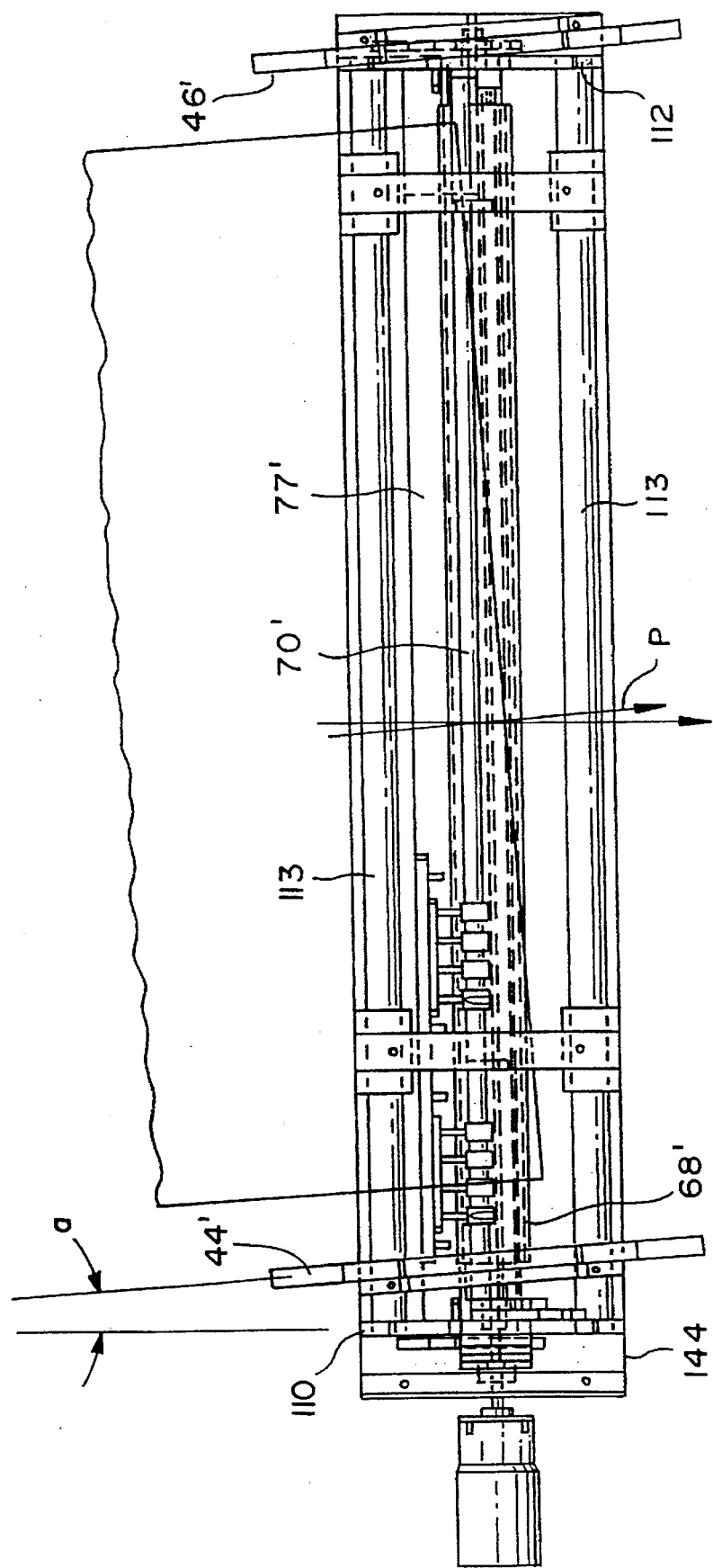
FIG. 10 is a plan view of a preferred form of peeling apparatus which is incorporated in the preferred apparatus.
Figure 11:
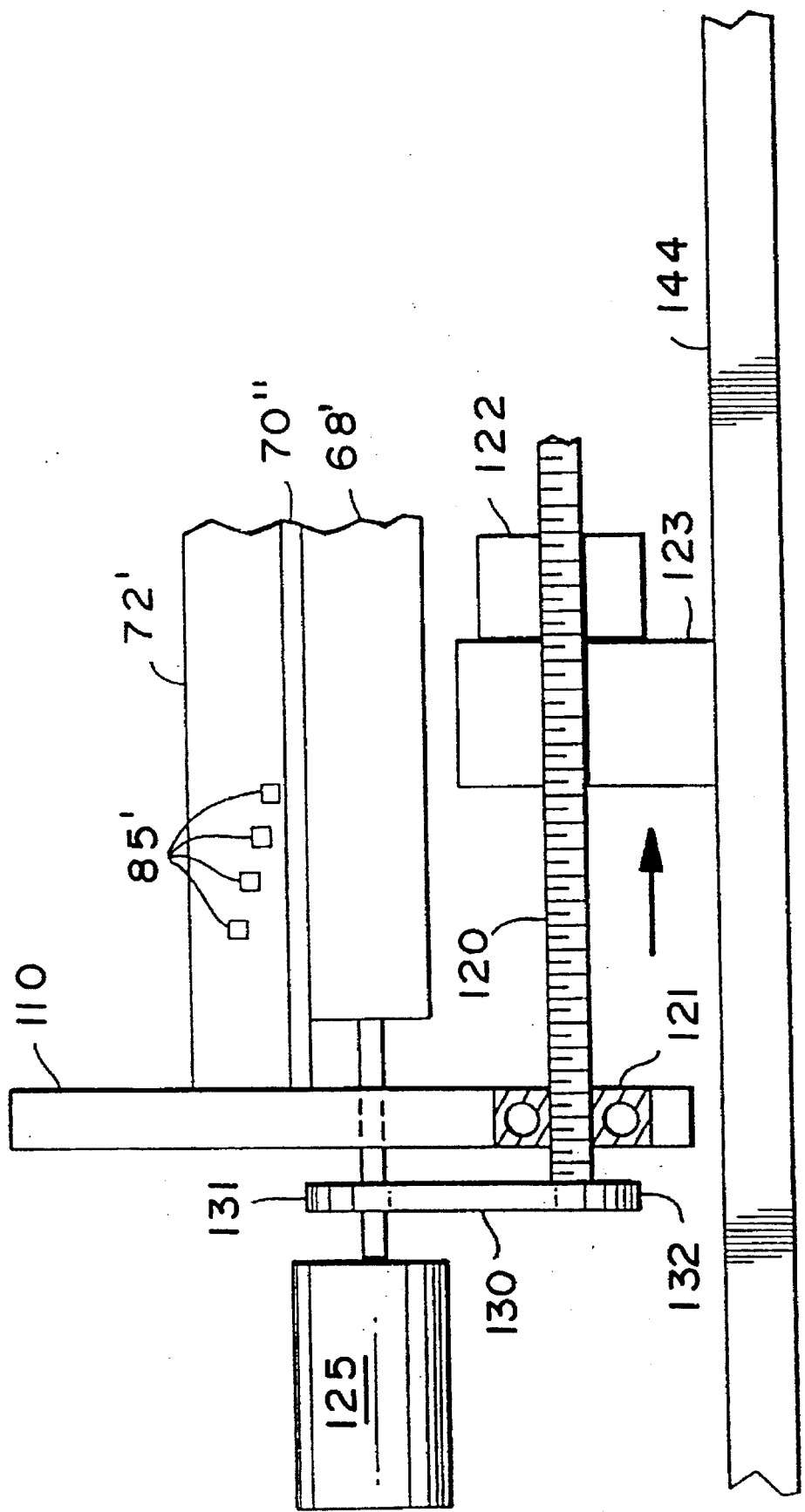
FIG. 11 is a fragmental, side elevational view in a diagrammatic form, of the peeler apparatus of FIG. 10.
Figure 12:
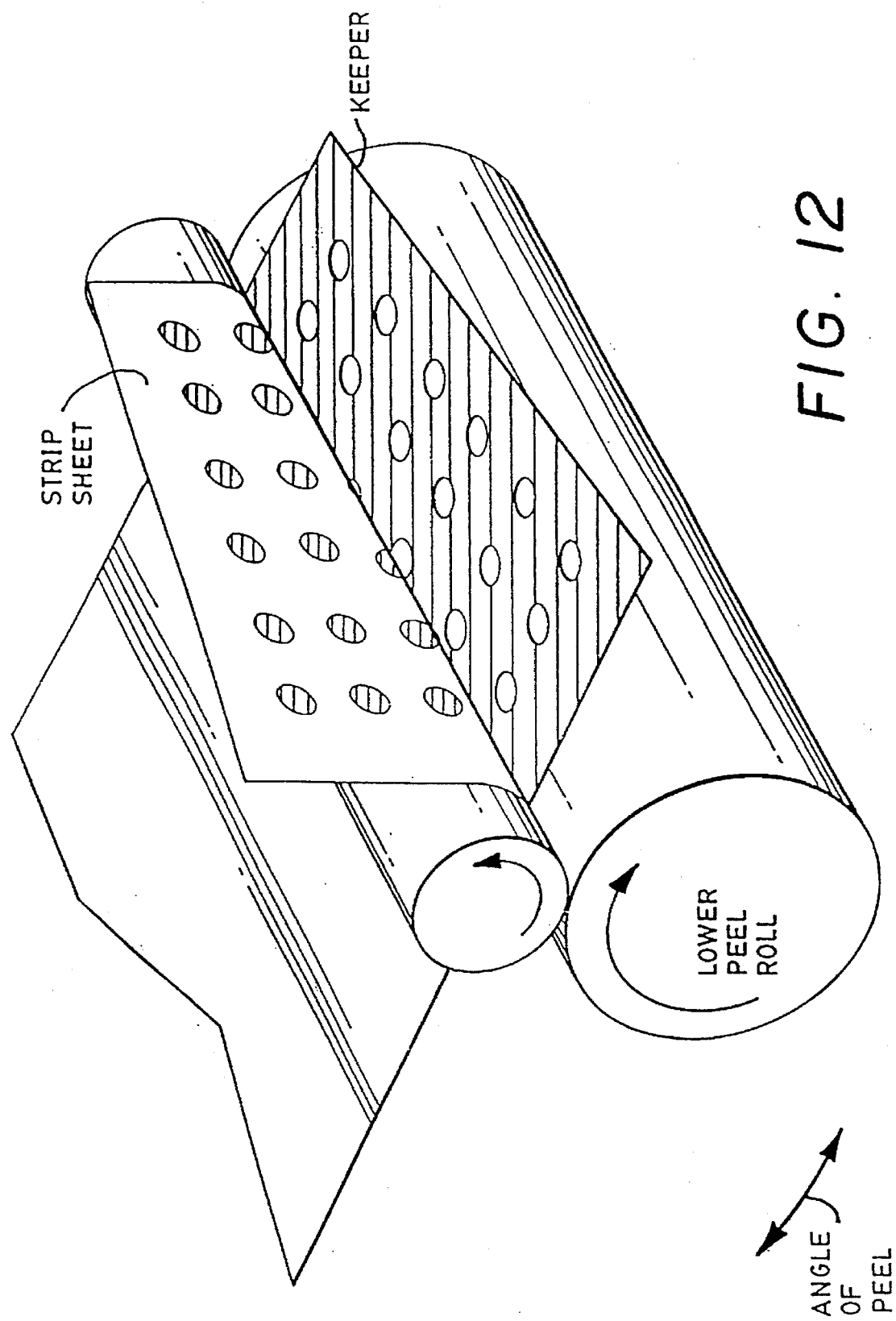
FIG. 12 is a schematic perspective view of a preferred peeling operation.
Figure 13A:
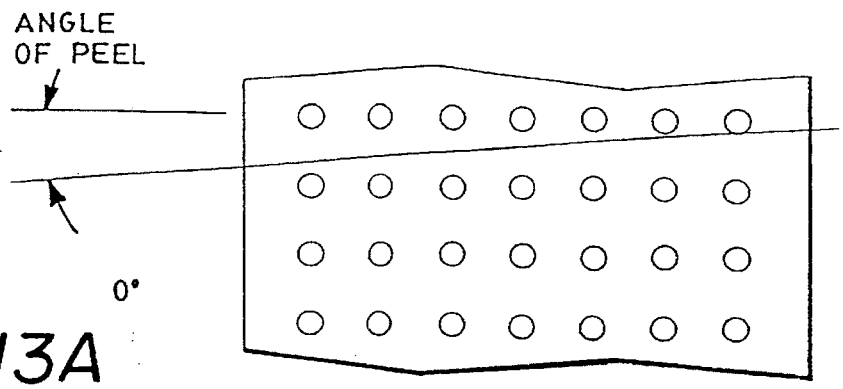
FIG. 13 A–D illustrate angled peeling with different screen angles of four (4) screen angles; and, FIG. 14 is an enlarged schematic view of the upper peel surface roll and a lower peel roll for minimizing image artifacts.
Figure 13B:
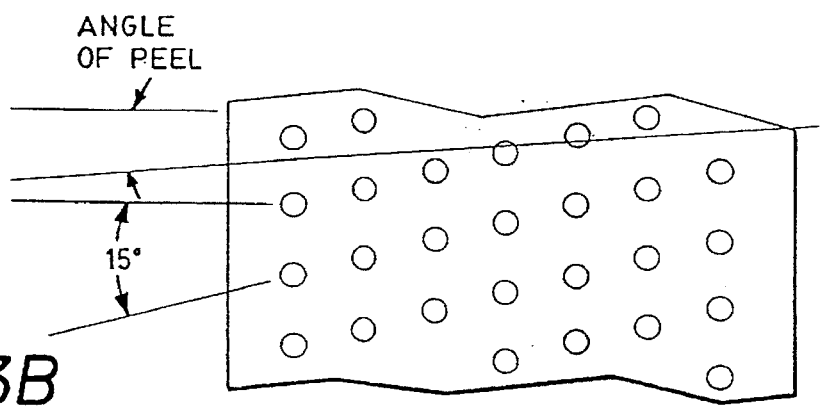
Figure 13C:
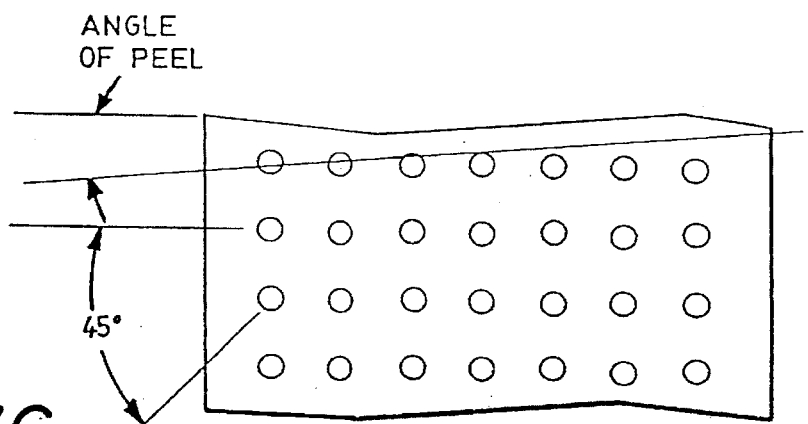
Figure 13D:
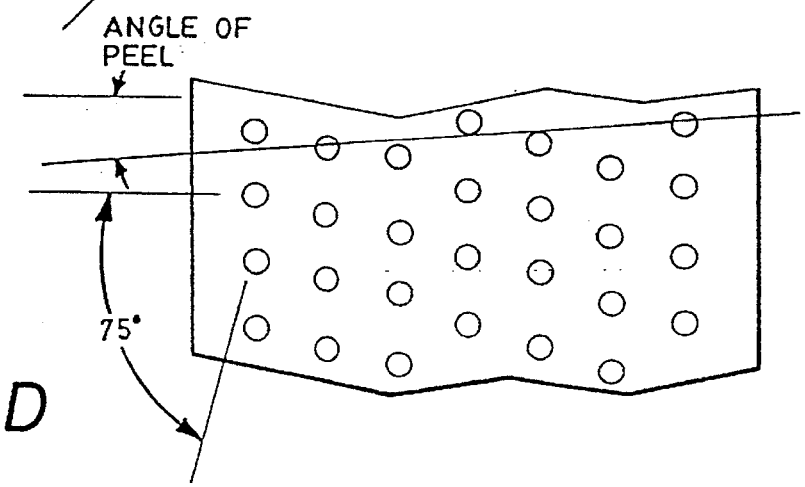

Referring now to FIGS. 10–13A–D, there is shown another preferred peeling method and apparatus. In the preferred apparatus, the peel surface roll 70 and peel roll 68 are arranged to extend at an angle to the longitudinal direction of the travel path P of the laminate which direction corresponds to the longitudinal axis or dimension of the laminate. For peeling laminates, to be used for multi-color printing, the image media is printed at screen angles. Screen angles are used in graphics art printing to avoid the occurrence of undesirable moiré patterns when multicolor halftone images are not properly angled. The halftones are made up of rows of halftone dots. For each color, the row of dots is at a different screen angle. The multiples of screen angles are selected based on the type of printing involved. In one particular mode, the screen angles for each color are at angles which are multiples of seven and one-half degrees (7 ½°). In this embodiment, it has been determined that to best minimize the occurrence of image artifacts of the aforementioned type, the peel angle PA (FIGS. 13A–D) is arranged to be at an angle intermediate, the screen angle used for imprinting the halftone dots. In other words, the peel front (i.e. that portion of the strip sheet in contact with the keeper sheet) is at an angle to the rows of halftone screen dots. In one preferred embodiment, the peel angle PA is one-half aforementioned the screen angle multiple or at about 3¾°. The peel angle can be at angles other than any screen angle selected. In the illustrated embodiment, the lower peel roll and the peel surface roll assembly are skewed approximately three and three-quarter degrees (3 ¾°) from their position shown in FIGS. 3 to 5 where they extend at ninety degrees (90°) to the longitudinal axis of the laminate and its travel path P (parallel to the leading edge of the laminate). The 3 ¾° angle offset is shown in FIGS. 10, 12, 13A–D. In this apparatus, the peel surface roll 70' and lower peel roll 68' are rotatably mounted in side plates 110, 112 which extend in the direction of travel at an angle of about 3 ¾° relative to the support walls 44, 46. This angle corresponds to about one half of the screen angle multiple mentioned above. The side plates 110, 112 are interconnected by the rods 113 and mounted for movement generally transverse to the path P of travel to enable the peel roll 68' and peel surface roll 70', to also move in this direction to maintain the laminate centered on the path of travel as shown in FIG. 10. In one specific apparatus shown in FIG. 11, such movement is achieved through a lead screw 120 threaded through threads 121 in a lower portion of the side plate 110, and also threaded through a nut 122 which is fixed to a mounting block 123 secured to a stationary frame plate 144 of the machine. A D.C. motor 125 for example is operatively connected to the shaft of the lower peel roll 68' to drive the same. A belt 130 trained about a pulley 131 on the motor shaft operatively connects the latter to a pulley 132 fixed to the lead screw 120. Rotation of motor 125 to drive the lower peel roll 68' will also cause side plates 110, 112 including the peel surface roll 70' and peel roll 68' carried by them, to move generally parallel to their axes or transversely of the path P so that the laminate will always stay centered between the main support walls 44, 46 of the machine even though the peel roll surface 70' and the peel roll 68' are skewed relative to the leading edge of the laminate or a transverse line extending at ninety degrees (90°) to and between the main side support walls 44, 46 of the machine. This will enable the upper layer of the laminate to be peeled at the desired angle. Although in the specific embodiment shown and described, the angle is three and three quarter degrees (3 ¾°) or about one half of the screen angle multiple of 7 ½°, in other screen angle systems, the peel roll 68' and peel surface 70' may be skewed at other appropriate angles to provide the desired angled peeling in accordance with the present invention. It will be noted that the vacuum cups 85' are not linearly disposed along the axis of the peel bar 72' but at angle which corresponds to the peel angle so that an angled portion of the strip sheet extending downstream of the nip can be held by the vacuum.

Although several specific and preferred methods and apparatus of the present invention have been shown and described above, other variations of the present invention will become apparent to those skilled in the art. The scope of the invention is therefore not limited to the specific forms shown and described but rather is indicated by the claims below.

What is claimed is:

1. A method of separating a layer from a laminate including image media, the method comprising the steps of: supporting the laminate adjacent an edge portion thereof, and striking at least one portion of the edge portion of the laminate to one side thereof from the opposite side thereof to bend the edge portion towards said one side thereof to separate one layer of the laminate from another layer thereof when the another layer moves away from the one layer; whereby the striking is done at a distance from the edge which will ensure imparting an adequate bending moment thereto: including the step of peeling said one layer from the laminate after initial separation; and further including the steps of after the layer is separated transporting the laminate along a path to a peeling station, bending the laminate to said one side about peel surface means, holding said one layer while permitting the remainder of the laminate to return towards said path, and peeling said one layer about the peel surface means and from the remainder as the remainder is transported along said path.

2. The method defined in claim 1 including the step of striking the laminate with a rotating member.

3. The method defined in claim 1 including the step of sequentially striking the edge portion along a first dimension thereof.

4. The method defined in claim 1 including the steps of transporting the laminate along a first direction into engagement with a stop to orient the laminate prior to striking the edge portion to separate said one layer.

5. The method defined in claim 4 including the step of peeling said one layer from the laminate after initial separation.

6. The method defined in claim 1 including the step of striking the edge portion of the laminate to one side thereof which has a relatively thinner layer than remaining layers.

7. The method defined in claim 1 including the step of striking the edge portion of the laminate a second time across the edge portion.

8. The method defined in claim 1 where a rotatable peel surface is employed to guide said one layer as it is peeled from the remainder.

9. The method defined in claim 8 wherein said peel surface has an arcuate configuration which has a radius of curvature that is dimensioned so that it will minimize the distance a peel point of the layer from the remainder of the laminate is located from a peeling nip so as to reduce the formation of any image artifacts.

10. The method defined in claim 1 wherein the remainder of the laminate is guided at a location downstream of the peel surface means such that the remainder extends at an angle relative to the path upstream of the peel surface means.

11. The method defined in claim 10 where said angle is selected to impart sufficient energy into the remainder so as to facilitate the separation of the exposed and unexposed areas of the image media.

12. The method defined in claim 1 wherein said one layer is held by vacuum as the remainder returns towards said path after which the vacuum hold on said one layer is released, and then said one layer is continuously peeled from the remainder.

13. The method defined in claim 1 wherein a constant tension force is applied to said one layer during peeling thereof.

14. The method defined in claim 1 further including the step of transporting said laminate over a peel roll located below and forming a nip with said peel surface, said peel surface having an arcuate shape about which said one layer is peeled, and positioning the peel surface with its radius of curvature offset relative to the nip relative to the radius of curvature of the peel roll.

15. The method defined in claim 1 including the steps of transporting the laminate over a peel roll located below the peel surface, moving the peel roll towards the peel surface to engage the laminate behind said edge portion prior to bending the laminate and peeling said layer.

16. The method defined in claim 1 wherein prior to holding said laminate, the lamination is bent to said one side and then permitted to return towards said path whereby the laminate is bent to said one side at least once just prior to peeling said one layer from the remainder.

17. The method defined in claim 1 including the steps of transporting the laminate through a nip defined by a peel surface and a peel roll and peeling the layer about the peel surface and from the laminate at an angle to the longitudinal dimension of the laminate, and wherein the peel surface and the peel roll are oriented at a predetermined angle offset relative to the path to produce angled peeling of the layer.

18. The method defined in claim 17 wherein the peel angle is at an angle other than a preselected screen angle of rows of exposed and unexposed areas of the laminate.

19. A method of peeling a laminate including image media, the method comprising the steps of: transporting the laminate along a path between a nip defined by a peel surface and a peel roll, bending the laminate about the peel surface to one side thereof downstream of the nip and permitting the laminate to return towards the path, holding said one layer after the laminate is bent again while permitting the laminate to return towards the path, and then peeling said one layer as the laminate is fed along the path.

20. The method defined in claim 19 including the step of: peeling the said layer at angle to the longitudinal direction of the laminate.

21. The method defined in claim 20 wherein the peeling angle is at an angle other than a screen angle at which imaged areas are formed on the laminate.

22. The method defined in claim 19 including the step of deflecting the laminate towards a side opposite said one side to extend at an angle as said layer is peeled from the laminate so as to impart sufficient energy to enhance separation of the imaged and non-imaged areas.

23. The method defined in claim 19 including the steps of: separating an edge portion of the laminate prior to transporting through the nip, engaging the laminate with the peel surface and the peel roll at a location behind the edge portion, and bending the separated edge portion of said layer about said peel surface and towards said one side thereof prior to peeling said layer.

24. The method defined in claim 19 including the steps of transporting the laminate through a nip defined by the peel surface and a peel roll, and peeling the layer about the peel surface at an angle to the longitudinal dimension of the laminate, and wherein the peel surface and the peel roll are oriented at a predetermined angle relative to the path to produce the angled peeling of the layer.

25. The method defined in claim 24 wherein the peel angle is at an angle other than a preselected screen angle of rows of exposed and unexposed areas of the laminate.

26. A method of peeling a layer from a laminate including image media, the method comprising the steps of: transporting the laminate along a path between a nip defined by a peel surface and a peel roll, bending the laminate to one side thereof downstream of the nip, holding said one layer by applying a vacuum thereto while permitting the laminate to return towards said path, and then peeling said layer from the laminate and about the peel surface as the laminate is transported along said path.

27. The method defined in claim 26 including the step of: separating an edge portion of the laminate prior to transportation through the nip, engaging the laminate with the peel surface and the peel roll at a location behind the edge portion, and bending the separated edge portion of said layer towards said one side thereof prior to peeling said layer.

28. Apparatus for separating a layer from a laminate including image media, the apparatus comprising in combination: means for supporting the laminate adjacent an edge portion thereof and means for sequentially striking the edge portion of the laminate first along a first dimension relative to the edge portion of the laminate to one side thereof from the opposite side thereof to bend the edge portion towards said one side thereof to separate said layer from the laminate and thereafter striking along a second dimension thereof extending transversely with respect to said first dimension and along the edge of the laminate.

29. Apparatus defined in claim 28 wherein said means includes a rotating member.

30. Apparatus defined in claim 29 wherein said rotating member is rotating upwardly upon striking the laminate to bend the laminate upwardly and to cause a thinner layer thereof to become separated from a thicker remainder of the laminate.

31. Apparatus defined in claim 29 wherein said rotating member is rotatable upwardly to strike the laminate to bend the laminate upwardly.

32. Apparatus defined in claim 29 wherein said means includes a second rotating member for striking the laminate a second time towards said one side thereof.

33. Apparatus defined in claim 32 wherein one rotating member includes a helical striking surface for initially striking the laminate and the second rotating member includes a second striking surface for striking the laminate after it has been struck by the helical surface.

34. Apparatus defined in claim 28 including means for striking the edge portion of the laminate sequentially across the edge portion surface.

35. Apparatus defined in claim 34 wherein said means includes a rotatable helical member.

36. Apparatus for peeling a layer from a laminate including image media, the apparatus comprising in combination: means for transporting a laminate along a path, a peel surface located on the path for guiding a layer to be stripped from the laminate as the layer is peeled from the laminate, means for bending the layer about the peel surface including a folder element and a linkage for moving the folder element, said folder element big engageable with the layer to bend the layer about the peel surface when the linkage is in a first position and spaced from the layer when the linkage is in a second position, means for driving the linkage between said positions thereof, and means for peeling the layer after the layer is bent about said peel surface, further including vacuum means for holding the layer after it has been bent about said peel surface.

37. Apparatus defined in claim 36 including deflecting means located downstream of the peel surface for engaging the laminate to maintain it at a predetermined angle, and means for driving the deflecting means between operative and inoperative positions in response to movement of the linkage.

38. Apparatus defined in claim 37 including an arm on which said deflecting means is mounted, said and being engageable by the linkage to be driven thereby in one direction when the linkage is moved to said second position.

39. Apparatus defined in claim 37 including vacuum means for holding the layer after it has been bent about the peel surface.

40. Apparatus defined in claim 39 including a nip on the path and being defined by said peel surface and a peel roll, said laminate being received in the nip while being bent by the folder element about the peel surface at a location downstream of the peel surface.

41. Apparatus defined in claim 40 including means located upstream of the nip for separating a leading edge portion of the layer from the laminate before passage into the nip.

42. Apparatus defined in claim 36 wherein said linkage includes a crank linkage, a second link pivoted to the crank, and a third link pivoted to the second link and carrying said folder element.

43. Apparatus defined in claim 36 including means located upstream of the nip for separating a leading edge portion of the layer from the laminate before passage into the nip.

44. A method of separating a layer from a laminate including image media, the method comprising the steps of: supporting the laminate adjacent an edge portion thereof, and striking the edge portion of the laminate to one side thereof from the opposite side thereof to bend the edge portion towards said one side thereof to separate one layer of the laminate from another layer thereof; and transporting the laminate along a path to a nip after said layer is separated, said nip being defined by a peel surface and a peel roll having longitudinal axes parallel to each other, orienting the peel surface and peel roll with their longitudinal axes extending at an angle to the path of travel greater or less than ninety degrees (90°), and peeling said layer about the peel surface and at an angle to the longitudinal direction of the laminate while the laminate is driven through the nip.

45. A method of peeling a laminate including image media, the method comprising the steps of: driving the laminate along a path through a nip defined by a peel surface and a peel roll having parallel axes extending through their centers of curvature, and with the path extending generally parallel to a longitudinal dimension of the laminate, orienting the peel surface and the peel roll with their said axes extending at an angle other than ninety degrees (90°) with respect to the path and peeling a layer from the laminate and about the peel surface after it leaves the nip.

46. The method defined in claim 45 including the step of peeling the layer at an angle which is other than at a screen angle at which successive rows of imaged and non-imaged areas are formed on the laminate, wherein the screen angle of each row is at a predetermined angle relative to the longitudinal axis of the laminate.

47. The method defined in claim 45 including the step of: moving the peel surface and the peel roll in a direction parallel to their longitudinal axes across the path as the laminate is being driven through the nip and the layer is being peeled so that the correct peel direction is maintained.

48. The method defined in claim 45 including the step of: moving the peel surface and the peel roll in a direction transverse to their longitudinal axes across the path as the laminate is being driven through the nip and the layer is being peeled.

49. Apparatus for peeling a layer from a laminate of the type containing image media, the apparatus comprising in combination, means defining a path of travel for a laminate, and a nip defined by a peel surface and a peel roll positioned across said path to receive a laminate, said peel surface and peel roll being oriented relative to the path such that the nip extends transversely across the path at an angle other than ninety degrees (90°) whereby a layer may be peeled from a laminate at an angle to the longitudinal dimension of the laminate upon passage through the nip.

50. Apparatus defined in claim 49 including means for moving the peel surface and the peel roll together across the path as the laminate passes through the nip and the layer is peeled from the layer.

51. Apparatus defined in claim 50 including opposite supports spaced across the path receiving and mounting said peel surface and peel roll, and means for moving the supports transversely of the path.

52. Apparatus defined in claim 51 wherein said peel surface has an arcuate shape having a curvature which is sized to limit the extent to which a peel point of the peeled layer from the remainder of the laminate will be displaced relative to the nip.

53. The apparatus defined in claim 52 wherein said peel surface is on a rod rotatable about the axis of the rod.

54. The apparatus defined in claim 53 wherein said peel rod has a radius in the range of about 0.032 inch to about 0.125 inch.

55. The apparatus defined in claim 52 wherein the center of curvature of the peel surface is offset along the path from a curvature of the lower peel roll.

56. Apparatus defined in claim 49 including means for moving the peel surface and the peel roll generally parallel to their axes across the path as the laminate passes through the nip and the layer is peeled from the layer.

57. A method of peeling a laminate including image media comprising a disruptable exposable imaging layer which allows for separation between exposed and unexposed media regions, wherein a plurality of the regions are formed along scanned lines such that each of the scanned rows is at least a preselected screen angle with respect to each other, the method comprising the steps of: driving the laminate along a path through a nip defined by peel surface means and a peel roll having parallel axes extending through their longitudinal extent, and with the path extending generally parallel to a longitudinal dimension of the laminate, orienting the peel means and the peel roll with their said axes extending at an angle other than the preset screen angle and peeling a layer from the laminate and about the peel surface means after it leaves the nip.

58. The method defined in claim 57 wherein the oriented angle is intermediate the screen angle.

59. The method defined in claim 58 wherein the oriented angle is about one-half the difference of the screen angle.

60. A method of separating a layer from a laminate including image media, the method comprising the steps of: supporting the laminate adjacent an edge portion thereof, and striking the edge portion of the laminate to one side thereof from the opposite side thereof to bend the edge portion towards said one side thereof to separate one layer of the laminate from another layer thereof; wherein said step of striking includes sequentially striking the edge portion along a first dimension relative to the edge portion of the laminate; further wherein the laminate is struck along a second dimension thereof extending transversely with respect to said first dimension and along the edge of the laminate.

61. A method of separating a layer from a laminate including image media, the method comprising the steps of: supporting the laminate adjacent an edge portion thereof, and striking the edge portion of the laminate to one side thereof from the opposite side thereof to bend the edge portion towards said one side thereof to separate one layer of the laminate from another layer thereof; and after the layer is separated transporting the laminate along a path to a peeling station, bending the laminate to said one side about peel surface means, holding said one layer while permitting the remainder of the laminate to return towards said path, and peeling said one layer about the peel surface means and from the remainder as the remainder is transported along said path.

* * * * *